(12) United States Patent
Matsukura et al.

(10) Patent No.: US 12,057,525 B2
(45) Date of Patent: Aug. 6, 2024

(54) NITRIDE SEMICONDUCTOR LIGHT-EMITTING ELEMENT AND METHOD FOR MANUFACTURING NITRIDE SEMICONDUCTOR LIGHT-EMITTING ELEMENT

(71) Applicant: NIKKISO CO., LTD., Tokyo (JP)

(72) Inventors: Yusuke Matsukura, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 284 days.

(21) Appl. No.: 17/510,481

(22) Filed: Oct. 26, 2021

(65) Prior Publication Data

US 2022/0131042 A1 Apr. 28, 2022

(30) Foreign Application Priority Data

Oct. 27, 2020 (JP) .................................. 2020-179457

(51) Int. Cl.
*H01L 33/14* (2010.01)
*H01L 33/00* (2010.01)
(Continued)

(52) U.S. Cl.
CPC ........ *H01L 33/325* (2013.01); *H01L 33/0075* (2013.01); *H01L 33/025* (2013.01); *H01L 33/145* (2013.01)

(58) Field of Classification Search
CPC . H01L 33/007; H01L 33/0075; H01L 33/025; H01L 33/145; H01L 33/325
See application file for complete search history.

(56) References Cited

U.S. PATENT DOCUMENTS

| 10,193,016 | B2 | 1/2019 | Fujita et al. | |
|---|---|---|---|---|
| 2018/0019375 | A1 | 1/2018 | Fujita et al. | |
| 2020/0412101 | A1 * | 12/2020 | Takayama | H01S 5/2031 |

FOREIGN PATENT DOCUMENTS

| CN | 208336254 U | * | 1/2019 |
|---|---|---|---|
| JP | 2016-149544 A | | 8/2016 |
| JP | 2019083221 A | * | 5/2019 |

OTHER PUBLICATIONS

Taiwanese Official Action and Search Report dated Jul. 29, 2022 from related TW application No. 110138506 together with English language translation.

* cited by examiner

*Primary Examiner* — Matthew C Landau
*Assistant Examiner* — Dmitriy Yemelyanov
(74) *Attorney, Agent, or Firm* — Scully, Scott, Murphy & Presser, PC

(57) ABSTRACT

A nitride semiconductor light-emitting element includes an n-type semiconductor layer, a p-type semiconductor layer, an active layer, and an electron blocking layer comprising at least one layer. The at least one layer of the electron blocking layer includes a peak-containing layer having an n-type impurity concentration peak in an n-type impurity concentration distribution along a stacking direction. The n-type impurity concentration peak appears as a local maximum in the n-type impurity concentration distribution along the stacking direction in the peak-containing layer and has an n-type impurity concentration of not less than 10 times a smallest value of the n-type impurity concentration in a region along the stacking direction between positions that are separated from a position of the peak in the stacking direction on both sides in the stacking direction by 10% of a thickness of the peak-containing layer.

8 Claims, 7 Drawing Sheets

(51) Int. Cl.
*H01L 33/02* (2010.01)
*H01L 33/32* (2010.01)

NITRIDE SEMICONDUCTOR LIGHT-EMITTING ELEMENT AND METHOD FOR MANUFACTURING NITRIDE SEMICONDUCTOR LIGHT-EMITTING ELEMENT

CROSS-REFERENCE TO RELATED APPLICATION

The present application is based on Japanese Patent Application No. 2020-179457 filed on Oct. 27, 2020, the entire contents of which are incorporated herein by reference.

BACKGROUND OF THE INVENTION

1. Field of the Invention

The invention relates to a nitride semiconductor light-emitting element and a method for manufacturing a nitride semiconductor light-emitting element.

2. Related Art

JP 2016/149544 A discloses a nitride semiconductor light-emitting element in which an electron blocking layer is provided between an active layer and a p-type semiconductor layer. The electron blocking layer is formed to have an Al composition ratio relatively higher than that of the active layer and has a large band gap. In JP 2016/149544 A, it is also described that leakage of electrons through the active layer into the p-type semiconductor layer (i.e., an overflow phenomenon) can be suppressed by providing the electron blocking layer.

Furthermore, in the nitride semiconductor light-emitting element described in JP 2016/149544 A, the electron blocking layer is doped with silicon (Si) as an n-type impurity. Thus, a p-type impurity from the p-type semiconductor layer is attracted to the silicon in the electron blocking layer and diffusion of the p-type impurity into the active layer is suppressed, hence, life of the nitride semiconductor light-emitting element is extended.

However, simply entirely or partially doping the electron blocking layer with the n-type impurity as in the nitride semiconductor light-emitting element described in JP 2016/149544 A is not effective enough to suppress diffusion of the p-type impurity into the active later in some cases, hence, there is room for improvement.

THE SUMMARY OF THE INVENTION

The invention was made in view of the circumstances described above and it is an object of the invention to provide a nitride semiconductor light-emitting element and a method for manufacturing a nitride semiconductor light-emitting element which can suppress diffusion of a p-type impurity into an active layer.

To achieve the object described above, the invention provides a nitride semiconductor light-emitting element, comprising:
an n-type semiconductor layer;
a p-type semiconductor layer;
an active layer provided between the n-type semiconductor layer and the p-type semiconductor layer; and
an electron blocking layer comprising at least one layer and being provided between the active layer and the p-type semiconductor layer,
wherein the at least one layer of the electron blocking layer comprises a peak-containing layer having an n-type impurity concentration peak in an n-type impurity concentration distribution along a stacking direction, and
wherein the n-type impurity concentration peak appears as a local maximum in the n-type impurity concentration distribution along the stacking direction in the peak-containing layer and has an n-type impurity concentration of not less than 10 times a smallest value of the n-type impurity concentration in a region along the stacking direction between positions that are separated from a position of the peak in the stacking direction on both sides in the stacking direction by 10% of a thickness of the peak-containing layer.

To achieve the object described above, the invention also provides a method for manufacturing a nitride semiconductor light-emitting element that comprises an n-type semiconductor layer, a p-type semiconductor layer, an active layer provided between the n-type semiconductor layer and the p-type semiconductor layer, and an electron blocking layer comprising at least one layer and being provided between the active layer and the p-type semiconductor layer, the method comprising:
in a process of making the peak-containing layer constituting the at least one layer of the electron blocking layer, forming the peak-containing layer so that an n-type impurity concentration peak appears in an n-type impurity concentration distribution along a stacking direction in the peak-containing layer,
wherein the n-type impurity concentration peak appears as a local maximum in the n-type impurity concentration distribution along the stacking direction in the peak-containing layer and has an n-type impurity concentration of not less than 10 times a smallest value of the n-type impurity concentration in a region along the stacking direction between positions that are separated from a position of the peak in the stacking direction on both sides in the stacking direction by 10% of a thickness of the peak-containing layer.

Effects of the Invention

According to the present invention, it is possible to provide a nitride semiconductor light-emitting element and a method for manufacturing a nitride semiconductor light-emitting element which can suppress diffusion of a p-type impurity into an active layer.

BRIEF DESCRIPTION OF THE DRAWINGS

Next, the present invention will be explained in more detail in conjunction with appended drawings, wherein.

DESCRIPTION OF THE PREFERRED EMBODIMENTS

Embodiment

An embodiment of the invention will be described in reference to FIGS. 1 to 8. The embodiment below is described as a preferred illustrative example for implementing the invention. Although some part of the embodiment specifically illustrates various technically preferable matters, the technical scope of the invention is not limited to such specific aspects.

(General Configuration of Nitride Semiconductor Light-Emitting Element 1)

Figure 1:
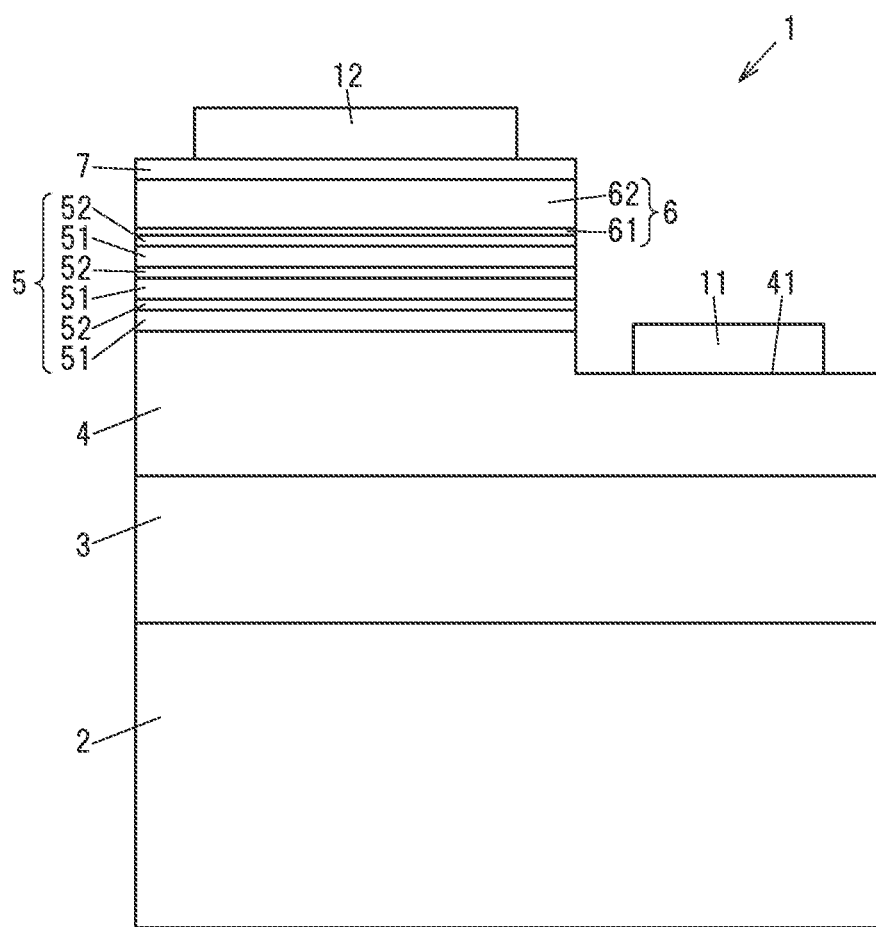
FIG. 1 is a schematic diagram illustrating a configuration of a nitride semiconductor light-emitting element in an embodiment.

FIG. 1 is a schematic diagram illustrating a configuration of a nitride semiconductor light-emitting element 1 in the present embodiment. In FIG. 1, a scale ratio of each layer of the nitride semiconductor light-emitting element 1 in a stacking direction is not necessarily the same as the actual scale ratio. Hereinafter, the nitride semiconductor light-emitting element 1 is sometimes simply referred to as "the light-emitting element 1".

The light-emitting element 1 can an element constituting, e.g., a light-emitting diode (LED) or a semiconductor laser diode (LD). The light-emitting element 1 in the present embodiment constitutes a deep ultraviolet LED that emits deep ultraviolet light at a central wavelength of not more than 365 nm. In particular, the light-emitting element 1 in the present embodiment is configured to be capable of emitting, e.g., deep ultraviolet light of not less than 200 nm and not more than 365 nm. The light-emitting element 1 can be used in fields such as, e.g., sterilization (e.g., air purification, water purification, etc.), medical treatment (e.g., light therapy, measurement/analysis, etc.), UV curing, etc.

Among direct transition-type nitride semiconductors, binary to quaternary group III nitride semiconductors with a composition expressed by, e.g., $Al_xGa_yIn_{1-x-y}N$ can be used as a semiconductor constituting the light-emitting element 1. X and y here satisfy the relations $0 \leq x \leq 1$, $0 \leq y \leq 1$ and $0 \leq x+y \leq 1$. In deep ultraviolet LEDs, aluminum gallium nitride (AlGaN)-based semiconductors not including indium are often used. AlGaN is a ternary mixed crystal in which a ratio of a composition of group III elements (i.e., a total composition of aluminum (Al) and gallium (Ga)) to a composition of nitrogen (N) is 1:1, and an aluminum composition ratio and a gallium composition ratio are arbitrary. In this regard, some of the group III elements constituting the light-emitting element 1 may be substituted with group III elements such as boron (B) or thallium (Tl), and nitrogen may be partially substituted with group V elements such as phosphorus (P), arsenic (As).

As shown in FIG. 1, the light-emitting element 1 is formed by stacking a substrate 2, a buffer layer 3, an n-type cladding layer 4, an active layer 5, an electron blocking layer 6 and a p-type contact layer 7 in this order. In the present embodiment, the electron blocking layer 6 has a two-layer structure in which a first layer 61 in contact with the active layer 5 and a second layer 62 in contact with the p-type contact layer 7 are stacked. Here, a direction of stacking the substrate 2, the buffer layer 3, the n-type cladding layer 4, the active layer 5, the electron blocking layer 6 and the p-type contact layer 7 (i.e., a vertical direction in FIG. 1) is simply referred to as the "stacking direction". In addition, the substrate 2-side of the light-emitting element 1 in the stacking direction is referred to as a lower side, and the opposite side thereto, i.e., the p-type contact layer 7-side with respect to the substrate 2 is referred to as an upper side. However, the terms "upper" and "lower" are used for descriptive purposes and do not limit the posture of the light-emitting element 1 with respect to the vertical direction when, e.g., the light-emitting element 1 is used. In the present embodiment, each layer constituting the light-emitting element 1 has a thickness in the stacking direction.

The light-emitting element 1 further includes an n-side electrode 11 provided on the n-type cladding layer 4, and a p-side electrode 12 provided on the p-type contact layer 7. Next, each constituent element of the light-emitting element 1 will be described in detail.

(Substrate 2)

The substrate 2 is a sapphire substrate including a sapphire ($Al_2O_3$) single crystal. Alternatively, e.g., an aluminum nitride (AlN) substrate or an aluminum gallium nitride (AlGaN) substrate may be used as the substrate 2 instead of the sapphire substrate.

(Buffer Layer 3)

The buffer layer 3 is made of aluminum nitride. When the substrate 2 is an AlN substrate or an AlGaN substrate, the buffer layer 3 may not be necessarily included.

(N-Type Cladding Layer 4)

The n-type cladding layer 4 is made of $Al_qGa_{1-q}N$ doped with silicon (Si) as an n-type impurity. The subscript q in the composition $Al_qGa_{1-q}N$ of the n-type cladding layer 4 indicates an Al composition ratio of the n-type cladding layer 4 and satisfies $0 < q \leq 1$. In the present embodiment, the Al composition ratio of AlGaN constituting the n-type cladding layer 4 is not less than 50% and not more than 60%. In other words, q satisfies $0.5 \leq q \leq 0.6$. The Al composition ratio of AlGaN constituting the n-type cladding layer 4 is preferably as small as possible in a range larger than the Al composition ratio of AlGaN constituting a well layer 52 (described later) of the active layer 5. In addition, in the present embodiment, a dopant concentration (an Si concentration) in the n-type cladding layer 4 is not less than $0.5 \times 10^{19}$ [atoms/cm$^3$] and not more than $2.5 \times 10^{19}$ [atoms/cm$^3$]. As the n-type impurity to dope the n-type cladding layer 4, germanium (Ge), selenium (Se) or tellurium (Te), etc., may alternatively be used in place of silicon. In addition, the structure of the n-type cladding layer 4 may be a single layer structure or may be a multilayer structure.

(Active Layer 5)

The active layer 5 is a layer including a multiple quantum well structure (a quantum well structure) in which three barrier layers 51 and three well layers 52 are alternately stacked so that the barrier layer 51 is located at an end on the n-type cladding layer 4-side and the well layer 52 is located at an end on the electron blocking layer 6-side. The active layer 5 generates light at a predetermined wavelength by recombination of electrons with holes in the multiple quantum well structure. In the present embodiment, the active layer 5 is configured to have a band gap of not less than 3.4 eV so that deep ultraviolet light at a wavelength of not more than 365 nm can be output. Particularly in the present embodiment, the active layer 5 is configured so that deep ultraviolet light at a central wavelength of not less than 200 nm and not more than 365 nm can be generated. In this regard, the numbers of the barrier layers 51 and the well layers 52 are not limited to three each, and may be two each or not less than four each. Alternatively, the structure may be a single quantum well structure in which one barrier layer 51 and one well layer 52 are provided.

Each barrier layer 51 is made of $Al_rGa_{1-r}N$. The subscript r in the composition $Al_rGa_{1-r}N$ of each barrier layer 51 indicates the Al composition ratio of each barrier layer 51 and satisfies 0≤r≤1. In the present embodiment, the Al composition ratio of AlGaN constituting each barrier layer 51 is not less than 85% and not more than 95%. In other words, r satisfies 0.85≤r≤0.95. The barrier layer 51 is an undoped layer in the present embodiment but may be a layer including at least one of n-type and p-type impurities. In addition, a film thickness of each barrier layer 51 can be in a range of, e.g., about 2 nm to 50 nm, and is preferably not less than 5 nm and not more than 20 nm. In the present embodiment, the film thickness of each barrier layer 51 is not less than 5 nm and not more than 9 nm.

Each well layer 52 is made of $Al_sGa_{1-s}N$. The subscript s in the composition $Al_sGa_{1-s}N$ of each well layer 52 indicates the Al composition ratio of each well layer 52 and satisfies 0≤s≤1. In the present embodiment, the Al composition ratio of AlGaN constituting each well layer 52 is not less than 30% and not more than 40%. In other words, s satisfies 0.3≤s≤0.4. In addition, each well layer 52 has a thickness of not less than 2.0 nm and not more than 3.5 nm. When the structure of the active layer 5 is, e.g., a multiple quantum well structure, it is possible to adopt a structure in which the well layers 52 except the well layer 52 in contact with the electron blocking layer 6 include an n-type impurity. In an n-type impurity concentration distribution along the stacking direction in the plural well layers 52, the largest value of the dopant concentration (the Si concentration) is not less than $1 \times 10^{19}$[atoms/cm$^3$] and not more than $6 \times 10^{19}$[atoms/cm$^3$].

(First Layer 61)

The first layer 61 of the electron blocking layer 6 is formed on the active layer 5. The first layer 61 serves to improve efficiency of electron injection into the active layer 5 by suppressing occurrence of the overflow phenomenon in which electrons passing through the active layer 5 leak into the p-type contact layer 7-side. In other words, the first layer 61 serves to reflect electrons, which passed through the active layer 5 toward the upper side from the n-type cladding layer 4-side, back toward the active layer 5.

The first layer 61 has a composition expressed by $Al_aGa_{1-a}N$. Here, the subscript a in the composition $Al_aGa_{1-a}N$ of the first layer 61 indicates the Al composition ratio of the first layer 61 and satisfies 0<a≤1. In the present embodiment, the first layer 61 can have, e.g., an Al composition ratio a of not less than 80%. The Al composition ratio a of the first layer 61 is larger than the Al composition ratio of the second layer 62 and the Al composition ratio of the p-type contact layer 7. Here, the larger the Al composition ratio of the first layer 61 which has a composition expressed by AlGaN, the more the electron blocking effect of suppressing the passage of electrons can be improved. In the present embodiment, by forming the first layer 61 with the very high Al composition ratio a at a position adjacent to the active layer 5, it is possible to exert a high electron blocking effect at a position close to the active layer 5 and it is easy to improve electron existence probability in the well layers 52.

In the present embodiment, the first layer 61 is doped with magnesium as a p-type impurity. It is also possible to use zinc (Zn), beryllium (Be), calcium (Ca), strontium (Sr), barium (Ba) or carbon (C), etc., as the p-type impurity. Alternatively, the first layer 61 may be made of undoped AlGaN.

A thickness (i.e., a size in the stacking direction) of the first layer 61 is preferably not more than 30 nm in view of reducing an electrical resistance value of the entire light-emitting element 1. The thickness of the first layer 61 is more preferably not less than 0.5 nm and not more than 5.0 nm in view of reducing the electrical resistance value as well as improving the electron blocking effect of preventing the passage of electrons.

(Second Layer 62)

The second layer 62 of the electron blocking layer 6 is formed on the first layer 61. Firstly, one of the reasons why the second layer 62 is provided on the first layer 61 will be described.

The Al composition ratio of the first layer 61 is significantly increased in view of improving the electron blocking effect, hence, there is a concern that the electrical resistance value becomes excessively large if the thickness thereof is increased. Therefore, it is difficult to increase the thickness of the first layer 61, and the first layer 61 is formed relatively thin in the light-emitting element 1. However, when the thickness of the first layer 61 is reduced, there is a concern that the tunneling effect increases the probability that electrons pass through the first layer 61 from the lower side to the upper side.

Therefore, the second layer 62 having a smaller Al composition ratio than the Al composition ratio of the first layer 61 and a smaller electric resistivity than that of the first layer 61 is formed on the first layer 61. By forming the very thin first layer 61 with a significantly high Al composition ratio and providing the second layer 62 thereon as described above, it is possible to reflect electrons, which passed through the first layer 61 toward the upper side due to the tunnelling effect, back toward the active layer 5 while preventing an excessive increase in the electrical resistance value of the entire light-emitting element 1. The second layer 62 is provided on the first layer 61 for the reason described above.

The second layer 62 has a composition expressed by $Al_bGa_{1-b}N$. Here, the subscript b in the composition $Al_bGa_{1-b}N$ of the second layer 62 indicates the Al composition ratio of the second layer 62 and satisfies 0≤b≤1. An Al composition ratio b of the second layer 62 is smaller than the Al composition ratio a of the first layer 61, i.e., b<a. For example, the Al composition ratio a of the first layer 61 can be not less than 80%, and the Al composition ratio b of the second layer 62 is smaller than the Al composition ratio a of the first layer 61 and can be not less than 50% and not more than 90%. In addition, the Al composition ratio b of the second layer 62 is larger than an Al composition ratio a of the p-type contact layer 7 (described later). The Al composition ratio b of the second layer 62 is particularly preferably 40% or more larger than the Al composition ratio a of the p-type contact layer 7. In other words, the Al composition ratio a of the first layer 61, the Al composition ratio b of the second layer 62 and the Al composition ratio a of the p-type contact layer 7 preferably satisfy a+0.4≤b<a. The Al composition ratio a of the p-type contact layer 7 can be not less than 0% and not more than 40%, and is preferably 0% in view of reducing contact resistance between the p-type contact layer 7 and the p-side electrode 12.

A thickness (i.e., a size in the stacking direction) of the second layer 62 is preferably not less than 15 nm. The upper limit of the thickness of the second layer 62 is preferably not more than 100 nm in view of reducing the electrical resistance value, and is more preferably not less than 20 nm and not more than 75 nm in view of reducing the electrical resistance value as well as improving the electron blocking effect. The thickness of the second layer 62 can be, e.g., not less than 5 times and not more than 20 times the thickness of the first layer 61. In addition, the thickness of the second layer 62 is larger than the thickness of the p-type contact layer 7.

<Al Composition Ratio Distribution>

Figure 2A:
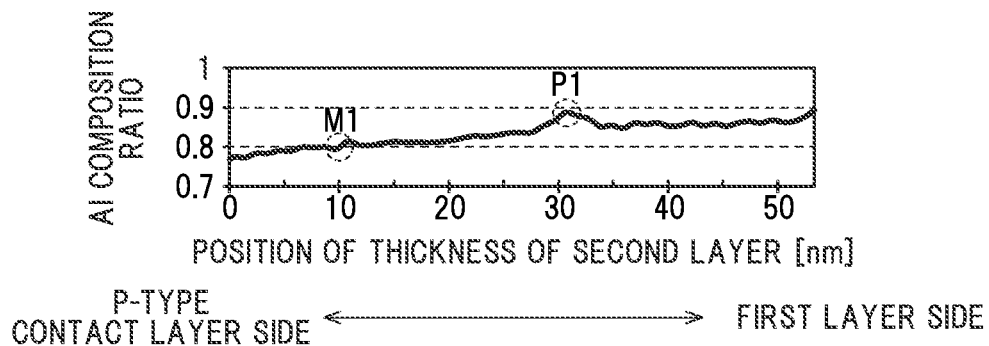
FIG. 2A is a diagram illustrating an example of an Al composition ratio distribution along a stacking direction in a second layer.
Figure 2B:
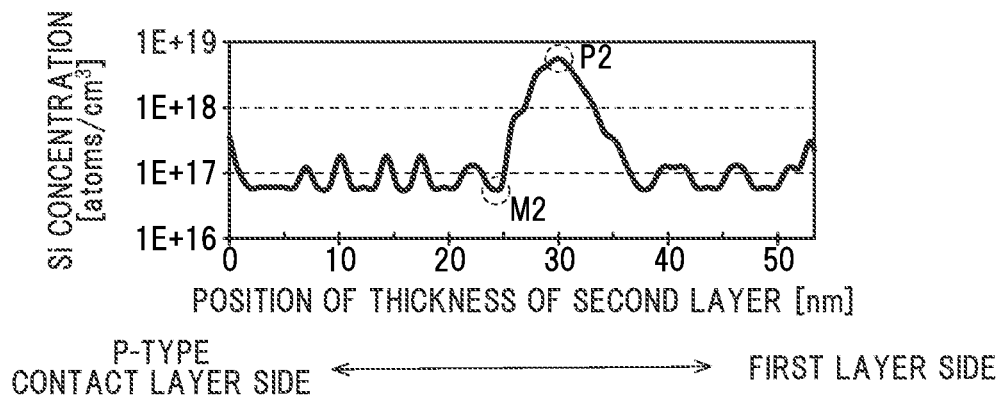
FIG. 2B is a diagram illustrating an example of an n-type impurity concentration distribution along the stacking direction in the second layer.
Figure 2C:
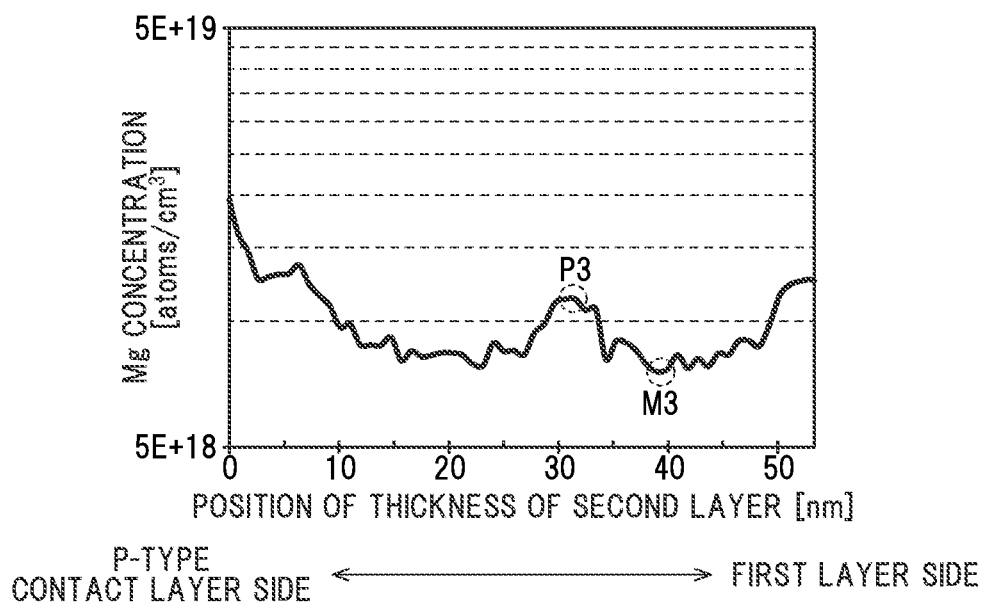
FIG. 2C is a diagram illustrating an example of a p-type impurity concentration distribution along the stacking direction in the second layer.

FIG. 2A is a diagram illustrating an example of an Al composition ratio distribution along the stacking direction in the second layer 62. In FIGS. 2A to 2C, the right side of the graph is the first layer 61-side (i.e., the lower side) and the left side of the graph is the p-type contact layer 7-side (i.e., the upper side). FIGS. 2B and 2C will be described later.

In the present embodiment, the Al composition ratio distribution along the stacking direction in the second layer 62 was measured by secondary ion mass spectrometry (SIMS). The general shape of the Al composition ratio distribution along the stacking direction in the second layer 62 in the present embodiment is inclined so as to gradually increase toward the first layer 61-side in the stacking direction. With this configuration, a sudden change in the Al composition ratio between the second layer 62 and the layer adjacent to the second layer 62 is easily suppressed and it is possible to reduce a lattice constant difference and suppress occurrence of dislocations. In this regard, the general shape of the Al composition ratio distribution along the stacking direction in the second layer 62 in the present embodiment may not be inclined.

The second layer 62 has at least one Al composition ratio peak P1 in the Al composition ratio distribution along the stacking direction. In other words, the second layer 62 has a local maximum point at which the Al composition ratio is locally high, in the Al composition ratio distribution along the stacking direction. Accordingly, the Al composition ratio of the second layer 62 is locally high in at least a part of a region along the stacking direction. In the present embodiment, the second layer 62 has one Al composition ratio peak P1 in the Al composition ratio distribution along the stacking direction.

Figure 3:
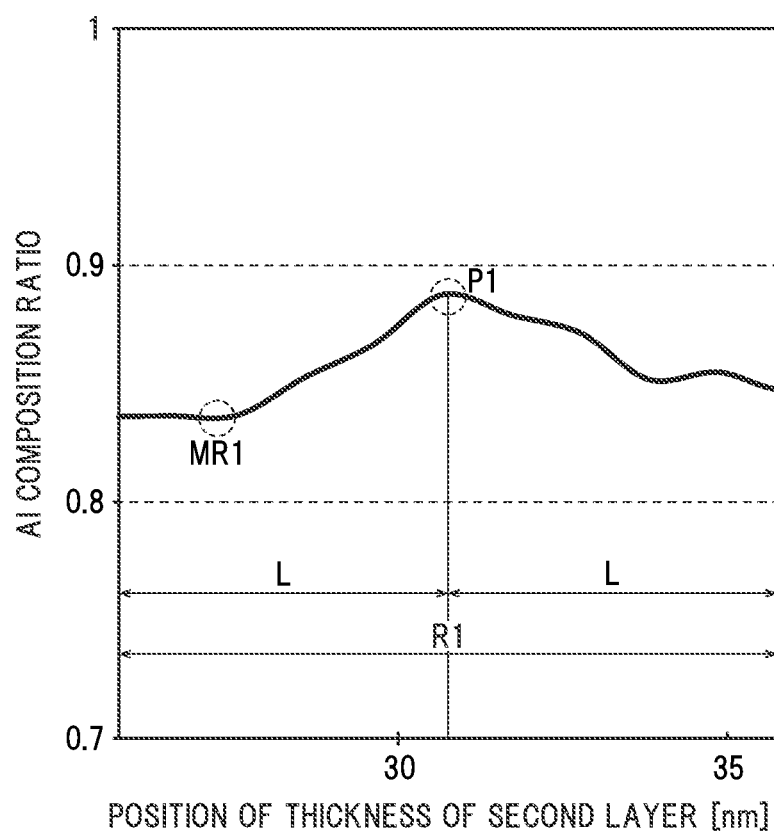
FIG. 3 is an enlarged view of a part of FIG. 2A.

FIG. 3 is an enlarged view of a part of FIG. 2A. Hereinafter, a thickness which is 10% of the thickness of the second layer 62 will be referred to as a 10% thickness L [nm]. The Al composition ratio peak P1 appears as a local maximum in the Al composition ratio distribution along the stacking direction in the second layer 62 and has an Al composition ratio of not less than 1.05 times the smallest value MR1 of the Al composition ratio in a region R1 along the stacking direction between positions that are separated from the position of the Al composition ratio peak P1 in the stacking direction on both sides in the stacking direction by the 10% thickness L. In the present embodiment, the 10% thickness L is 5 nm.

In addition, it is preferable that the Al composition ratio at the Al composition ratio peak P1 be not less than 1.05 times with respect to the least squares approximation line for the Al composition ratio distribution along the stacking direction in the second layer 62.

In addition, the Al composition ratio peak P1 preferably has an Al composition ratio of not less than 1.07 times the smallest value M1 of the Al composition ratio in the Al composition ratio distribution along the stacking direction in the second layer 62, as shown in FIG. 2A. The smallest value M1 here is the smallest value among the Al composition ratios at various positions of the second layer 62 in the stacking direction that are located on the lower side of a position 10 nm away on the lower side from a boundary between the second layer 62 and the p-type contact layer 7. When the Al composition ratio distribution along the stacking direction in the second layer 62 is measured by the secondary ion mass spectrometry, the region from the boundary between the second layer 62 and the p-type contact layer 7 to the position 10 nm away on the lower side is a region where it is difficult to estimate an accurate Al composition ratio.

In addition, the Al composition ratio at the Al composition ratio peak P1 is preferably not less than 85%. In the present embodiment, the Al composition ratio at the Al composition ratio peak P1 is 88.8%. Furthermore, the Al composition ratio peak P1 is preferably a local maximum with the largest Al composition ratio among local maximums appearing in the Al composition ratio distribution along the stacking direction in the second layer 62.

The Al composition ratio peak P1 preferably exists on a side close to the first layer 61 in the stacking direction with respect to the middle position of the second layer 62, as shown in FIG. 2A. In this case, it is possible to form the Al composition ratio peak P1 at a position closer to the active layer 5 which is a source of electron overflow, and it is easy to enhance the electron blocking effect. In this regard, the Al composition ratio peak P1 may exist on a side close to the p-type contact layer 7 in the stacking direction with respect to the middle position of the second layer 62. In addition, when there are plural Al composition ratio peaks P1 in the Al composition ratio distribution along the stacking direction in the second layer 62, the Al composition ratio peaks P1 may exist on both sides of the middle position. In this case, in view of easily ensuring the electron blocking effect, it is preferable that more Al composition ratio peaks P1 exist on the first layer 61-side of the middle position of the second layer 62 than on the p-type contact layer 7-side of the middle position of the second layer 62.

Figure 4:
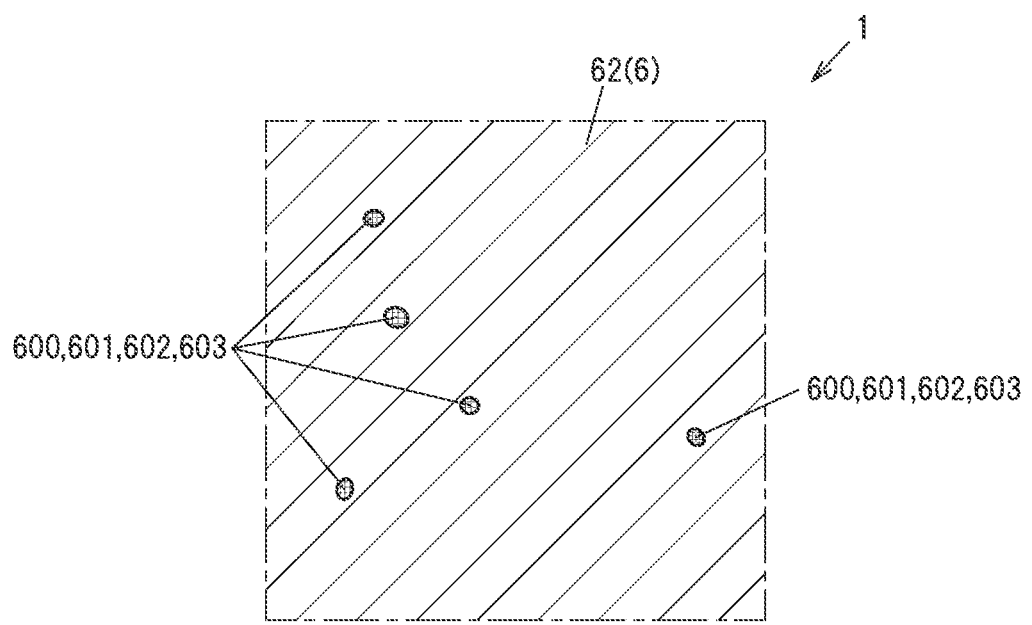
FIG. 4 is a schematic diagram illustrating a specific cross section in the embodiment.

FIG. 4 is a schematic diagram illustrating a cross section of the second layer 62 that is orthogonal to the stacking direction and is taken at the position of the Al composition ratio peak P1 in the stacking direction. Hereinafter, when simply referring to "the cross section", it means a cross section orthogonal to the stacking direction, unless otherwise specified. In the present embodiment, the second layer 62 partially has a high Al composition portion 601 with an Al composition ratio higher than the surrounding portion in the cross section taken at the position of the at least one Al composition ratio peak P1 in the stacking direction. Hereinafter, the cross section of the second layer 62 in which the high Al composition portion is partially formed as shown in FIG. 4 is referred to as a specific cross section. The high Al composition portion 601 is a silicon nitride-containing portion 600 containing silicon nitride ($SiN_x$) and is a part with an Al composition ratio increased due to preferential incorporation of aluminum which is likely to be attracted to silicon nitride. That is, since the high Al composition portion 601 is partially present in the specific cross section, the Al composition ratio peak P1 is formed at the position in the stacking direction where the specific cross section is present.

In the specific cross section of the second layer 62, the Al composition ratio of the high Al composition portion 601 is 1.03 times or more larger than the average value of the Al composition ratio in the entire specific cross section. For example, in the specific cross section of the second layer 62, the Al composition ratio of the high Al composition portion 601 is 88.8% and the average value of the Al composition ratio in the entire specific cross section is 84.2%. In addition, in the specific cross section of the second layer 62, the Al composition ratio of the part other than the high Al composition portion 601 is uniform and is, e.g., 79.6%. In the specific cross section of the second layer 62, the Al composition ratio of the high Al composition portion 601 is not less than 1.12 times the Al composition ratio of the part other than the high Al composition portion 601.

In addition, in the specific cross section of the second layer 62, a percentage of the area of the high Al composition portion 601 can be not less than 30% and not more than 70%. As shown in FIG. 4, the high Al composition portion 601 is formed in a dispersed manner in the specific cross section of the second layer 62. In particular, the high Al composition portion 601 is scattered in the specific cross section of the second layer 62. However, it is not limited thereto and the high Al composition portion 601 may be present intermittently in, e.g., a stripe pattern in the specific cross section of the second layer 62.

<N-Type Impurity Concentration Distribution>

The second layer 62 contains silicon as an n-type impurity in a part of a region in the stacking direction. In addition to silicon, oxygen (O) may be contained as the n-type impurity. When, e.g., the second layer 62 is exposed to the atmosphere and silicon is oxidized during manufacturing the light-emitting element 1, the second layer 62 may unintentionally contain oxygen. Germanium, selenium or tellurium, etc., may be also used as the n-type impurity.

FIG. 2B is a diagram illustrating an example of an n-type impurity concentration distribution along the stacking direction in the second layer 62. In the present embodiment, the n-type impurity concentration distribution along the stacking direction in the second layer 62 was measured by the secondary ion mass spectrometry. The second layer 62 is a peak-containing layer having at least one n-type impurity concentration peak P2 in the n-type impurity concentration distribution along the stacking direction. In other words, the n-type impurity concentration in the second layer 62 is locally high in at least a part of the region in the stacking direction. In the present embodiment, the second layer 62 has one n-type impurity concentration peak P2 in the n-type impurity concentration distribution along the stacking direction. P-type impurities are likely to be attracted to n-type impurities, but it is possible to prevent diffusion of p-type impurities from the p-type contact layer 7 into the active layer 5 by providing the n-type impurity concentration peak P2 in the second layer 62.

Figure 5:
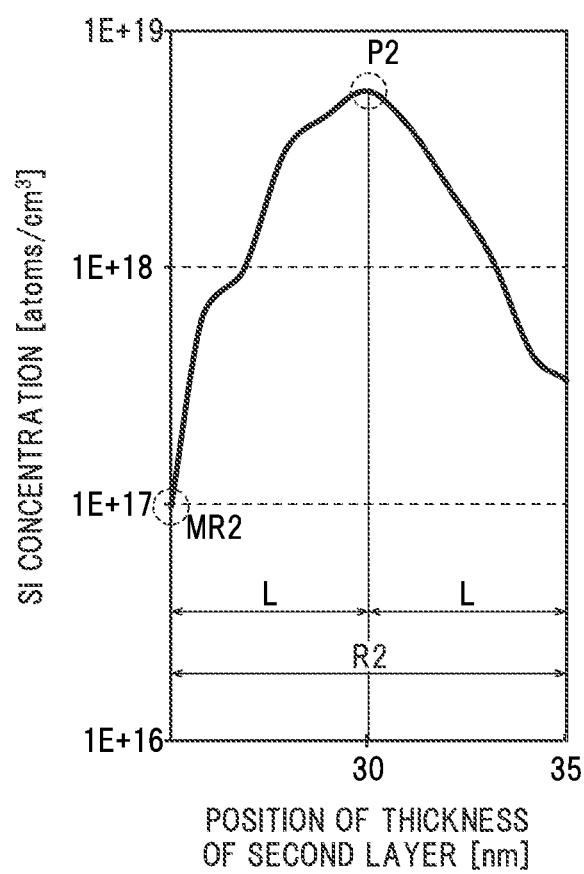
FIG. 5 is an enlarged view of a part of FIG. 2B.

FIG. 5 is an enlarged view of a part of FIG. 2B. The n-type impurity concentration peak P2 appears as a local maximum in the n-type impurity concentration distribution along the stacking direction in the second layer 62 and has an n-type impurity concentration of not less than 10 times the smallest value MR2 of the n-type impurity concentration in a region R2 along the stacking direction between positions that are separated from the position of the n-type impurity concentration peak P2 in the stacking direction on both sides in the stacking direction by the 10% thickness L.

In addition, it is preferable that the n-type impurity concentration at the n-type impurity concentration peak P2 be not less than 10 times with respect to the least squares approximation line for the n-type impurity concentration distribution along the stacking direction in the second layer 62.

In addition, the n-type impurity concentration peak P2 preferably has an n-type impurity concentration of not less than 21 times the smallest value M2 of the n-type impurity concentration in the n-type impurity concentration distribution along the stacking direction in the second layer 62, as shown in FIG. 2B. Furthermore, the n-type impurity concentration peak P2 more preferably has an n-type impurity concentration which is $1.0 \times 10^{18}$ [atoms/cm$^3$] or more higher than the smallest value M2 of the n-type impurity concentration in the n-type impurity concentration distribution along the stacking direction in the second layer 62.

In addition, the n-type impurity concentration at the n-type impurity concentration peak P2 is preferably not less than $1.0 \times 10^{18}$ [atoms/cm$^3$]. More preferably, the n-type impurity concentration at the n-type impurity concentration peak P2 is not less than $1.0 \times 10^{18}$ [atoms/cm$^3$] and not more than $1.0 \times 10^{20}$ [atoms/cm$^3$]. In the present embodiment, the n-type impurity concentration at the n-type impurity concentration peak P2 is $5.55 \times 10^{18}$ [atoms/cm$^3$]. Furthermore, the n-type impurity concentration peak P2 is preferably a local maximum with the largest n-type impurity concentration among local maximums appearing in the n-type impurity concentration distribution along the stacking direction in the second layer 62.

In the present embodiment, the position in the stacking direction at which the n-type impurity concentration peak P2 exists is the same position as the position in the stacking direction at which the Al composition ratio peak P1 in the stacking direction exists. The same position here means that, e.g., at least a portion of the region R2 along the stacking direction above and below the position of the n-type impurity concentration peak P2 within the 10% thickness L [nm] and a portion of the region R1 along the stacking direction above and below the position of the Al composition ratio peak P1 within the 10% thickness L [nm] are formed at the same position in the stacking direction.

In the specific cross section of the second layer 62, the part in which the high Al composition portion 601 is formed (i.e., the silicon nitride-containing portion 600 containing silicon nitride) is also a high n-type impurity concentration portion 602 with an n-type impurity concentration higher than the surrounding portion. In the specific cross section of the second layer 62, the n-type impurity concentration in the high n-type impurity concentration portion 602 is not less than 10 times the n-type impurity concentration in the entire specific cross section.

The positions of the n-type impurity concentration peak P2 and the Al composition ratio peak P1 in the stacking direction may be off from one another. In such a case, it is preferable that the n-type impurity concentration peak P2 be formed on the p-type contact layer 7-side with respect to the Al composition ratio peak P1. In this case, the n-type impurity concentration peak P2 is formed near the p-type contact layer 7 from which the p-type impurity is diffused, and diffusion of the p-type impurity is inhibited near the p-type contact layer 7 (i.e., a p-type impurity diffusion source). Furthermore, since the Al composition ratio peak P1 is formed on the active layer 5-side with respect to the n-type impurity concentration peak P2, it is possible to reflect electrons toward the active layer 5 at a position closer to the active layer 5 and it is easy to improve electron existence probability in the active layer 5.

The n-type impurity in the second layer 62 is present at the position of the n-type impurity concentration peak P2 in the second layer 62 in the stacking direction in at least any of the following states: the solid solution state in the crystal, the cluster state and the state in which a compound containing the n-type impurity is precipitated. The solid solution state of the n-type impurity in the crystal in the second layer 62 is the state in which silicon is doped in AlGaN constituting the second layer 62, i.e., the state in which silicon is located at the lattice positions of AlGaN. Meanwhile, the cluster state of the n-type impurity in the second layer 62 is the state in which silicon excessively doped in AlGaN constituting the second layer 62 is present at the lattice positions of AlGaN and is also present as aggregates, etc., between the lattice positions. The state in which a compound containing the n-type impurity is precipitated in the second layer 62 is the state in which, e.g., silicon nitride, etc., is formed.

The portion of the second layer 62 other than the position in the stacking direction at which the n-type impurity concentration peak P2 exists does not contain the n-type impurity in the present embodiment but may contain the n-type impurity. For example, an n-type impurity concentration may be present in a region of the second layer 62 on the p-type contact layer 7-side with respect to the position in the stacking direction at which the n-type impurity concentration peak P2 exists. In this case, the n-type impurity concentration in such a region is preferably less than $1.0 \times 10^{18}$ [atoms/cm$^3$], particularly not more than $5.0 \times 10^{17}$ [atoms/cm$^3$], in view of improving crystallinity, and is more preferably the background level, i.e., an n-type impurity concentration that is detected when not intentionally doped with the n-type impurity (e.g., a range of $1.0 \times 10^{17} \pm 5 \times 10^{16}$ [atoms/cm$^3$]).

<P-Type Impurity Concentration Distribution>

In the present embodiment, the second layer 62 contains magnesium (Mg) as a p-type impurity. As the p-type impurity, it is also possible to use zinc, beryllium, calcium, strontium, barium or carbon, etc. A p-type impurity concentration in the entire second layer 62 is not less than the p-type impurity concentration in the first layer 61 and is less than the p-type impurity concentration in the p-type contact layer 7 (described later).

FIG. 2C is a diagram illustrating an example of a p-type impurity concentration distribution along the stacking direction in the second layer 62. In the present embodiment, the p-type impurity concentration distribution along the stacking direction in the second layer 62 was measured by the secondary ion mass spectrometry. The second layer 62 has at least one p-type impurity concentration peak P3 in the p-type impurity concentration distribution along the stacking direction. In other words, the p-type impurity concentration in the second layer 62 is locally high in at least a part of the region along the stacking direction.

Figure 6:
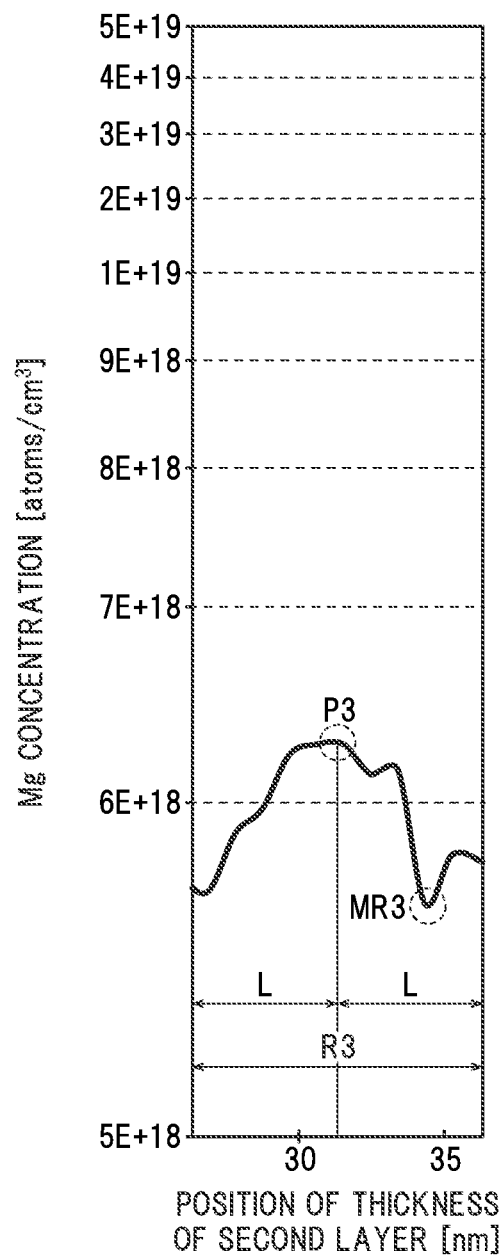
FIG. 6 is an enlarged view of a part of FIG. 2C.

FIG. 6 is an enlarged view of a part of FIG. 2C. The p-type impurity concentration peak P3 appears as a local maximum in the p-type impurity concentration distribution along the stacking direction in the second layer 62 and has a p-type impurity concentration of not less than 1.2 times the smallest value MR3 of the p-type impurity concentration in a region R3 along the stacking direction between positions that are separated from the position of the p-type impurity concentration peak P3 in the stacking direction on both sides in the stacking direction by the 10% thickness L.

In addition, it is preferable that the p-type impurity concentration at the p-type impurity concentration peak P3 be not less than 1.2 times with respect to the least squares approximation line for the p-type impurity concentration distribution along the stacking direction in the second layer 62.

In addition, the p-type impurity concentration peak P3 preferably has a p-type impurity concentration of not less than 1.25 times the smallest value M3 of the p-type impurity concentration in the p-type impurity concentration distribution along the stacking direction in the second layer 62, as shown in FIG. 2C.

In addition, the p-type impurity concentration peak P3 can be a local maximum at which the p-type impurity concentration is not less than $1.05 \times 10^{19}$ [atoms/cm$^3$]. More preferably, the p-type impurity concentration peak P3 is not less than $1.05 \times 10^{19}$ [atoms/cm$^3$] and not more than $5.0 \times 10^{20}$ [atoms/cm$^3$]. In the present embodiment, the p-type impurity concentration at the p-type impurity concentration peak P3 is $1.13 \times 10^{19}$ [atoms/cm$^3$].

In the present embodiment, in the specific cross section of the second layer 62, the part in which the high Al composition portion 601 is formed (i.e., the silicon nitride-containing portion 600) is also a high p-type impurity concentration portion 603 with a p-type impurity concentration higher than the surrounding portion. That is, in the present embodiment, the silicon nitride-containing portion 600 partially appearing in the specific cross section also serves as the high Al composition portion 601, the high n-type impurity concentration portion 602 and the high p-type impurity concentration portion 603. The part of the second layer 62 other than the high Al composition portion 601, the high n-type impurity concentration portion 602 and the high p-type impurity concentration portion 603 is a part made of AlGaN.

Accordingly, in the present embodiment, the p-type impurity concentration peak P3 is formed at the same position in the stacking direction as the Al composition ratio peak P1 and the n-type impurity concentration peak P2. The same position here means that, e.g., at least a portion of the region R1 along the stacking direction above and below the position of the Al composition ratio peak P1 within the 10% thickness L [nm], a portion of the region R2 along the stacking direction above and below the position of the n-type impurity concentration peak P2 within the 10% thickness L [nm] and a portion of the region R3 along the stacking direction above and below the position of the p-type impurity concentration peak P3 within the 10% thickness L [nm] are formed at the same position in the stacking direction.

The p-type impurity in the second layer 62 is present at the position of the p-type impurity concentration peak P3 in the second layer 62 in the stacking direction in at least any of the following states: the solid solution state in the crystal, the cluster state and the state in which a compound containing the p-type impurity is precipitated.

A part of the second layer 62 on the lower side of the region in the stacking direction in which silicon nitride is formed can be made of undoped AlGaN or AlGaN doped with the p-type impurity. Meanwhile, a part of the second layer 62 on the upper side of the region in the stacking direction in which silicon nitride is formed can be made of undoped AlGaN or AlGaN doped with at least one of the p-type impurity and the n-type impurity.

Alternatively, plural second layers 62 having an Al composition ratio smaller than the Al composition ratio of the first layer 61 and a thickness larger than the thickness of the first layer 61 may be provided on the first layer 61. In addition, an electron blocking layer which does not satisfy the requirements of the second layer 62 described above may be further provided at least either between the second layer 62 and the first layer 61 or on the second layer 62 on the opposite side to the first layer 61 (i.e., on the upper side).

(P-Type Contact Layer 7)

The p-type contact layer 7 constitutes the p-type semiconductor layer and is formed on the second layer 62, as shown in FIG. 1. The p-type contact layer 7 is a layer for forming ohmic contact with the p-side electrode 12. In the present embodiment, the p-type contact layer 7 is a p-type GaN layer doped with a high concentration of magnesium as the p-type impurity. GaN is a binary mixed crystal of gallium and nitrogen. The p-type impurity concentration in the p-type contact layer 7 can be, e.g., $5.0 \times 10^{19}$ to $5.0 \times 10^{21}$ [atoms/cm$^3$]. Alternatively, the p-type contact layer 7 may be, e.g., a layer made of p-type AlGaN with the Al composition ratio of not more than 10%. As the p-type impurity, it is also possible to use zinc, beryllium, calcium, strontium, barium or carbon, etc.

The p-type contact layer 7 has a thickness in the stacking direction, and the thickness can be, e.g., not less than 1 nm and not more than 1,000 nm. The thickness of the p-type contact layer 7 is preferably not less than 5 nm, more preferably not less than 10 nm, in view of improving adhesion to the p-side electrode 12. The thickness of the p-type contact layer 7 is also preferably not more than 200 nm, more preferably not more than 30 nm, in view of facilitating extraction of deep ultraviolet light, which is emitted by the active layer 5, from the substrate 2 side. That is, it is easy to improve light output from the substrate 2 of the light-emitting element 1 since light loss, which occurs when upwardly-traveling deep ultraviolet light as part of the deep ultraviolet light emitted from the active layer 5 is reflected at the p-side electrode 12 and travels toward the substrate 2, is reduced by thinly forming the p-type contact layer 7.

A p-type cladding layer may be interposed between the second layer 62 and the p-type contact layer 7. In this case, the p-type cladding layer constitutes the p-type semiconductor layer and may be composed of, e.g., a p-type AlGaN layer. The Al composition ratio of the p-type cladding layer is between the Al composition ratio of the second layer 62 and the Al composition ratio of the p-type contact layer 7. By interposing such a p-type cladding layer between the p-type contact layer 7 and the second layer 62, it is possible to prevent occurrence of defects caused by lattice mismatch between the p-type contact layer 7 and the second layer 62 and improve crystallinity of the p-type contact layer 7.

(N-Side Electrode 11)

The n-side electrode 11 is formed on an exposed surface 41 of the n-type cladding layer 4 that is exposed from the active layer 5. The n-side electrode 11 is made of, e.g., a multilayered film formed by sequentially stacking titanium (Ti), aluminum, titanium and gold (Au) on the n-type cladding layer 4.

(P-Side Electrode 12)

The p-side electrode 12 is formed on the p-type contact layer 7. The p-side electrode 12 is made of, e.g., rhodium (Rh). The p-side electrode 12 is preferably made of a material with high UV reflectance.

(Method for Manufacturing Light-Emitting Element 1)

Next, a method for manufacturing the light-emitting element 1 in the present embodiment will be described. In the present embodiment, the buffer layer 3, the n-type cladding layer 4, the active layer 5, the first layer 61, the second layer 62 and the p-type contact layer 7 are epitaxially grown on the substrate 2 by the Metal Organic Chemical Vapor Deposition (MOCVD) method. That is, in the present embodiment, the substrate 2 is placed in a chamber and each layer is formed on the substrate 2 by introducing carrier gases, which are raw materials of each layer formed on the substrate 2, into the chamber. As the carrier gases to epitaxially grow each layer, it is possible to use trimethylaluminum (TMA) as an aluminum source, trimethylgallium (TMG) as a gallium source, ammonia ($NH_3$) as a nitrogen source, tetramethylsilane (TMSi) as a silicon source, and biscyclopentadienylmagnesium ($Cp_2Mg$) as a magnesium source. The manufacturing conditions for epitaxially growing each layer, such as growth temperature, growth pressure and growth time, etc., can be general conditions according to the configuration of each layer.

The MOCVD method is sometimes called the Metal Organic Vapor Phase Epitaxy (MOVPE) method. It is also possible to use another epitaxial growth method such as the Molecular Beam Epitaxy (MBE) method or the Hydride Vapor Phase Epitaxy (HVPE) method, etc., when epitaxially growing the buffer layer 3, the n-type cladding layer 4, the active layer 5, the first layer 61, the second layer 62 and the p-type contact layer 7 on the substrate 2. In the present embodiment, the method for making the second layer 62 is particularly devised, which will be described later.

After forming each layer on the substrate 2, a mask is formed on a portion of the p-type contact layer 7, i.e., a part other than the portion to be the exposed surface 41 of the n-type cladding layer 4 that is exposed from the active layer 5. Then, the region in which the mask is not formed is removed by etching from the upper surface of the p-type contact layer 7 to the middle of the n-type cladding layer 4 in the stacking direction. The exposed surface 41 exposed upward is thereby formed on the n-type cladding layer 4.

Subsequently, the n-side electrode 11 is formed on the exposed surface 41 of the n-type cladding layer 4 and the p-side electrode 12 is formed on the p-type contact layer 7 after removing the mask. The n-side electrode 11 and the p-side electrode 12 may be formed by, e.g., a well-known method such as electron beam evaporation method or sputtering method. The object completed through the above process is cut into pieces with a desired dimension and the light-emitting element 1 as shown in FIG. 1 is thereby obtained.

Now, a process of making the second layer 62 will be described in detail.

After sequentially forming the buffer layer 3, the n-type cladding layer 4, the active layer 5 and the first layer 61 on the substrate 2, the second layer 62 is formed on the first layer 61. To form the second layer 62, the first step, the second step, and the third step are performed in this order.

In the first step, trimethylaluminum as the aluminum source, trimethylgallium as the gallium source, ammonia as the nitrogen source and biscyclopentadienylmagnesium as the magnesium source are fed into the chamber. As a result, a layer-shaped part including AlGaN doped with magnesium as the p-type impurity is formed on the first layer 61.

Next, in the second step, feeding of trimethylaluminum, trimethylgallium and biscyclopentadienylmagnesium among the carrier gases fed into the chamber in the first step is stopped, and only tetramethylsilane and ammonia are fed as the carrier gases into the chamber. As a result, the silicon nitride-containing portion 600 as shown in FIG. 4 is formed so as to be scattered on the part formed in the first step.

Next, in the third step, the carrier gases fed into the chamber are changed back to the same as those in the first step, i.e., trimethylaluminum, trimethylgallium, ammonia and biscyclopentadienylmagnesium. As a result, a layer-shaped part including AlGaN doped with magnesium as the p-type impurity is formed. The second layer 62 partially having the high Al composition portion 601, the high n-type impurity concentration portion 602 and the high p-type impurity concentration portion 603 in at least one cross section orthogonal to the stacking direction is obtained through these steps.

Hereinafter, a region of the second layer 62 in the stacking direction in which the silicon nitride-containing portion 600 is present is referred to as a second part, the lower side (i.e., the first layer 61-side) of the second part is referred to as a first part, and the upper side (i.e., the p-type contact layer 7-side) of the second part is referred to as a third part. Here, since the second part formed in the second step has the silicon nitride-containing portion 600 scattered in a direction of a plane orthogonal to the stacking direction, the position in the stacking direction at which the second part is present is the position of the n-type impurity concentration peak P2 in the n-type impurity concentration distribution along the stacking direction in the second layer 62. Since aluminum is likely to become incorporated in the region in which the silicon nitride-containing portion 600 is formed, AlGaN with a high Al composition is likely to be formed in the silicon nitride-containing portion 600. Therefore, the Al composition ratio peak P1 in the Al composition ratio distribution along the stacking direction in the second layer 62 exists at the position in the stacking direction at which the second part is present. Furthermore, since magnesium as the p-type impurity has the property of being likely to bond to silicon, magnesium is also likely to become incorporated in the second part in which the silicon nitride-containing portion 600 is scattered. Therefore, the position in the stacking direction at which the second part is present is the position of the p-type impurity concentration peak P3 in the p-type impurity concentration distribution along the stacking direction in the second layer 62.

(Functions and Effects of the Embodiment)

The second layer 62 in the present embodiment has at least one n-type impurity concentration peak in the n-type impurity concentration distribution along the stacking direction. It is thus possible to suppress diffusion of the p-type impurity into the active layer 5, and as a result, it is possible to improve the luminous efficiency and extend the life. Details about this will be described below.

Firstly, when the p-type impurity is diffused into the active layer 5, dislocations are likely to be generated in the active layer 5 due to a difference in atomic radius between atoms of the matrix constituting the active layer 5 and the p-type impurity. When dislocations are present in the active layer 5, electrons and holes are likely to be consumed for non-luminescent recombination (e.g., recombination that generates vibration) and the luminous efficiency is likely to decrease. Furthermore, when dislocations are present in the active layer 5, deterioration due to occurrence of current concentration at the dislocation sites, etc., is likely to occur.

However, when the second layer 62 is formed so that the n-type impurity concentration peak appears in the n-type impurity concentration distribution along the stacking direction, the p-type impurity is likely to be attracted at the position of the n-type impurity concentration peak in the stacking direction and diffusion of the p-type impurity into the active layer 5 is suppressed. As a result, it is possible to improve the luminous efficiency of the light-emitting element 1 and extend the life of the light-emitting element 1.

Here, if the n-type impurity is present uniformly in the entire second layer 62, the effect of preventing diffusion of the p-type impurity into the active layer 5 may not be sufficiently obtained. On the other hand, in the present embodiment, it is possible to improve the effect of preventing diffusion of the p-type impurity into the active layer 5 by forming the second layer 62 so that the n-type impurity concentration peak exists at least one location in the stacking direction, and as a result, it is possible to improve the luminous efficiency and extend the life. In addition, in the present embodiment, the n-type impurity concentration peak has an n-type impurity concentration of not less than 21 times the smallest value of the n-type impurity concentration in the n-type impurity concentration distribution along the stacking direction in the second layer 62. Therefore, the above-described effect by having the n-type impurity concentration peak in the second layer 62 is obtained more easily.

The electron blocking layer 6 includes the first layer 61 formed adjacent to the upper side of the active layer 5 and the second layer 62 formed on the upper side of the first layer 61. In addition, the second layer 62 has at least one n-type impurity concentration peak in the n-type impurity concentration distribution along the stacking direction. That is, the n-type impurity concentration peak is formed so that the p-type contact layer 7 (the p-type semiconductor layer) diffusing the p-type impurity is closer to the n-type impurity concentration peak than to the first layer 61. As a result, it is possible to prevent diffusion of the p-type impurity at the position closer to the p-type impurity diffusion source.

The second layer 62 also has the Al composition ratio peak in addition to the n-type impurity concentration peak. Therefore, by providing the second layer 62, it is possible to suppress diffusion of the p-type impurity into the active layer to extend the life and increase the luminous efficiency, and at the same time, electrons which have passed through the first layer are easily reflected toward the active layer at the Al composition ratio peak portion of the second layer 62. When aluminum is present uniformly in the entire second layer 62, the electrical resistance value of the second layer 62 may excessively increase. However, in the present embodiment, since the second layer 62 is formed so that the Al composition ratio peak exists at least at one location in the stacking direction, it is possible to suppress an excessive increase in the electrical resistance value.

The second layer 62 also partially has the high Al composition portion 601 with an Al composition ratio higher than the surrounding portion in at least one cross section orthogonal to the stacking direction. In this way, since the high Al composition portion 601 is partially formed and the other part has a lower Al composition ratio in the second layer 62, it is possible to achieve both improvement in the electron blocking effect and suppression of the increase in the electrical resistance value. That is, it is possible to exert the electron blocking effect at the high Al composition portion 601, and it is possible to reduce the electrical resistance value in a region other than the high Al composition portion 601.

In addition, in the method for manufacturing the light-emitting element 1 in the present embodiment, the process of making the second layer 62 includes the step of forming the silicon nitride-containing portion containing $SiN_X$ in a part of a region of such an electron blocking layer in the stacking direction. Therefore, in the region of the second layer 62 in the stacking direction in which the silicon nitride-containing portion 600 is formed, the concentration of silicon as the n-type impurity increases and the composition ratio of aluminum, which is likely to become incorporated in the silicon nitride-containing portion 600, also increases. As a result, it is possible to easily make the second layer 62 in which both the n-type impurity concentration peak in the n-type impurity concentration distribution and the Al composition ratio peak in the Al composition ratio distribution are formed in the region in the stacking direction in which the silicon nitride-containing portion 600 is present.

As described above, according to the present embodiment, it is possible to provide a nitride semiconductor light-emitting element and a method for manufacturing a nitride semiconductor light-emitting element which can suppress diffusion of a p-type impurity into an active layer.

Example

Next, Example of the light-emitting element 1 will be described. The light-emitting element 1 in this Example is made by the same manufacturing method as for the light-emitting element 1 in the embodiment described above and has the same configuration as the basic configuration of the light-emitting element 1 in the embodiment described above. Among the reference numerals used hereinafter, the same reference numerals as those used in the above-mentioned embodiment indicate the same constituent elements, etc., as those in the above-mentioned embodiment, unless otherwise specified.

The thickness, the Al composition ratio, the Si concentration (i.e., the n-type impurity concentration) and the Mg concentration (i.e., the p-type impurity concentration) of each layer of the light-emitting element 1 in Example are shown in Table 1 below. In Table 1, the second part is a region of the second layer 62 in the stacking direction in which the silicon nitride-containing portion 600 is present, the first part is a region of the second layer 62 on the lower side (i.e., the first layer 61-side) of the second part, and the third part is a region of the second layer 62 on the upper side (i.e., the p-type contact layer 7-side) of the second part, as previously described. In addition, in Table 1, the Si concentration means the largest Si concentration in the Si concentration distribution along the stacking direction in each layer, and the Mg concentration means the largest Mg concentration in the Mg concentration distribution along the stacking direction in each layer.

TABLE 1

| | Structure | | Thickness | Al composition ratio [%] | Si concentration [atoms/cm³] | Mg concentration [atoms/cm³] |
|---|---|---|---|---|---|---|
| Example | Substrate | | 430 μm ± 25 [μm] | — | — | — |
| | Buffer layer | | 2,000 ± 200 [nm] | 100 | — | — |
| | n-type cladding layer | | 2,000 ± 200 [nm] | 55 ± 5.0 | (1.50 ± 1.00)E+19 | — |
| | Active layer (3QW) | Barrier layer | 7 ± 2 [nm] | 90 ± 5 | — | — |
| | | Well layer | 2.75 ± 0.75 [nm] | 35 ± 5 | (3.50 ± 2.50)E+19 | — |
| | Electron blocking layer | First layer | 2.0 ± 0.5 [nm] | 95 ± 5 | — | Up to 5.00E+19 |
| | | Second layer First part | 20 ± 5 [nm] | 85 ± 5 | — | 1.00E+18 to 5.00E+19 |
| | | Second layer Second part | 10 ± 5 [nm] | 85 ± 5 | (4.00 ± 2.50)E+19 | 5.00E+18 to 5.00E+19 |
| | | Third part | 25 ± 5 [nm] | 85 ± 5 | — | 1.00E+18 to 5.00E+19 |
| | p-type contact layer | | 10 ± 5 [nm] | 0 | — | 5.00E+19 to 5.00E+21 |

In Example, the thickness of each layer of the light-emitting element 1 was measured by a transmission electron microscope, and the Al composition ratio, the Si concentration and the Mg concentration in each layer of the light-emitting element 1 were each measured by the secondary ion mass spectrometry.

Comparative Example

Next, Comparative Example of the light-emitting element 1 will be described. The light-emitting element in this Comparative Example is different from the above-described embodiment in that the Al composition ratio of the second layer 62 is uniform in the stacking direction. The light-emitting element in Comparative Example does not have the Al composition ratio peak P1, the n-type impurity concentration peak P2 and the p-type impurity concentration peak P3. In addition, in the light-emitting element in Comparative Example, a p-type cladding layer is provided between the second layer 62 and the p-type contact layer 7. The p-type cladding layer is a layer that has the Al composition ratio between the Al composition ratio of the second layer 62 and the Al composition ratio of the p-type contact layer 7 and is doped with a p-type impurity. The remaining configuration of the light-emitting element in Comparative Example is the same as the light-emitting element 1 in the embodiment described above. In addition, the method for manufacturing the light-emitting element in Comparative Example is the same as the method for manufacturing the light-emitting element 1 in the embodiment described above. The thickness, the Al composition ratio, the Si concentration (i.e., the n-type impurity concentration) and the Mg concentration (i.e., the p-type impurity concentration) of each layer of the light-emitting element in Comparative Example are shown in Table 2 below.

TABLE 2

| | Structure | Thickness | Al composition ratio [%] | Si concentration [atoms/cm$^3$] | Mg concentration [atoms/cm$^3$] |
|---|---|---|---|---|---|
| Comparative Example | Substrate | 430 μm ± 25 [μm] | — | — | — |
| | Buffer layer | 2,000 ± 200 [nm] | 100 | — | — |
| | n-type cladding layer | 2,000 ± 200 [nm] | 55 ± 5.0 | (1.50 ± 1.00)E+19 | — |
| | Active layer (3QW) Barrier layer | 7 ± 2 [nm] | 90 ± 5 | — | — |
| | Active layer (3QW) Well layer | 2.75 ± 0.75 [nm] | 35 ± 5 | (3.50 ± 2.50)E+19 | — |
| | Electron blocking layer First layer | 2.0 ± 0.5 [nm] | 95 ± 5 | — | Up to 5.00E+19 |
| | Electron blocking layer Second layer | 25 ± 5 [nm] | 85 ± 5 | — | 1.00E+18 to 1.00E+20 |
| | p-type cladding layer | 25 ± 5 [nm] | 40 ± 5.0 | — | 1.00E+18 to 1.00E+20 |
| | p-type contact layer | 15 ± 5 [nm] | 0 | — | 5.00E+19 to 5.00E+21 |

In Comparative Example, the thickness of each layer of the light-emitting element was measured by a transmission electron microscope, and the Al composition ratio, the Si concentration and the Mg concentration in each layer of the light-emitting element were each measured by the secondary ion mass spectrometry.

(Light Output)

The initial light output of the light-emitting element 1 in Example is compared to the initial light output of the light-emitting element in Comparative Example. The initial light output is light output of the light-emitting element as-manufactured. The initial light output [mW] of each of the light-emitting elements in Example and Comparative Example when supplying a current of 350 mA thereto was measured. Measurement of light output was conducted by a photodetector placed under each of the light-emitting elements in Example and Comparative Example. The result is shown in the graph in FIG. 7.

Figure 7:
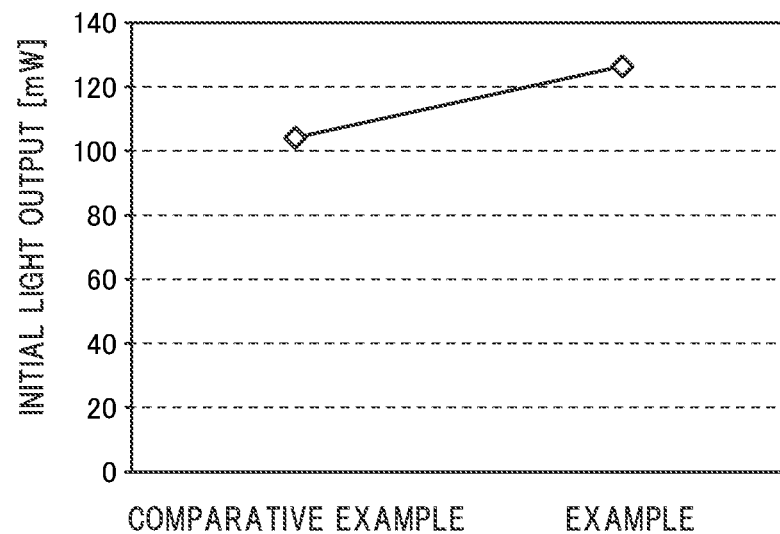
FIG. 7 is a graph comparing initial light outputs between Comparative Example and Example.

As understood from FIG. 7, the initial light output of the light-emitting element 1 in Example is 20 mW or more larger than the initial light output of the light-emitting element in Comparative Example. In the light-emitting element 1 in Example, by forming the second part containing silicon nitride in the second layer 62, it is possible to form the Al composition ratio peak P1 at the position of the second part. As a result, in the light-emitting element 1 in Example, it is possible to improve the probability that electrons passing through the first layer 61 are reflected toward the active layer 5, and the initial light output higher than that of the light-emitting element in Comparative Example can be obtained.

In addition, in the light-emitting element 1 in Example, by forming the second part containing silicon nitride in the second layer 62, it is possible to form the n-type impurity concentration peak P2 at the position of the second part. It is thus possible to suppress diffusion of the p-type impurity into the active layer 5 as previously described, and as a result, it is possible to improve the luminous efficiency of the light-emitting element 1.

(Emission Lifetime)

The emission lifetime of the light-emitting element 1 in Example is compared to the emission lifetime of the light-emitting element in Comparative Example. The initial light output [mW] of each of the light-emitting elements and the residual output [mW] of each of the light-emitting elements after supplying a current of 350 mA to each of the light-emitting elements in Example and Comparative Example for a predetermined time was measured. For this measurement, a current was continuously passed through the light-emitting element 1 in Example for 205 hours, and a current was continuously passed through the light-emitting element in Comparative Example for 192 hours. That is, in view of evaluation of the emission lifetime, the conditions for the light-emitting element 1 in Example are stricter than for the light-emitting elements in Comparative Example. Then, a ratio of the residual output to the initial light output of each of the light-emitting elements in the Example and Comparative Example was calculated as a residual percentage. The result is shown in the graph in FIG. 8.

Figure 8:
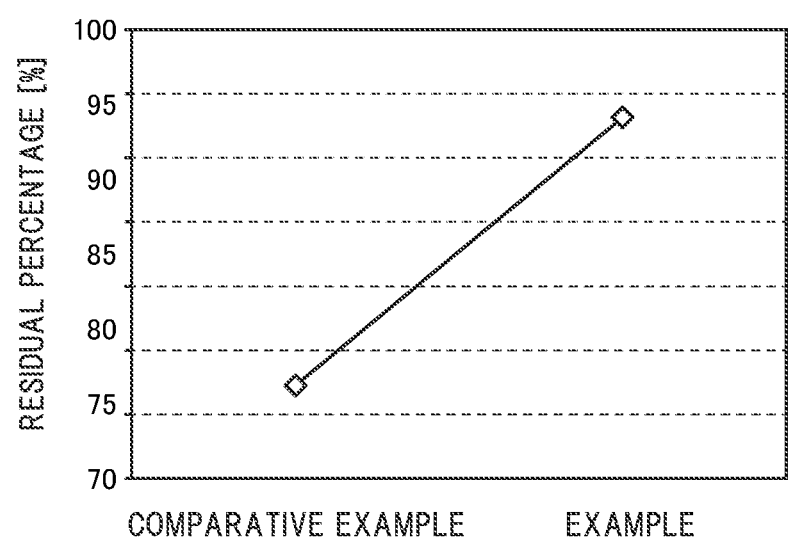
FIG. 8 is a graph comparing residual percentages between Comparative Example and Example.

As understood from FIG. 8, the residual percentage of the light-emitting element 1 in Example is 15% or more higher than the residual percentage of the light-emitting element in Comparative Example. That is, the emission lifetime of the light-emitting element 1 in Example is longer than that of the light-emitting element in Comparative Example. In the light-emitting element 1 in Example, by forming the second part containing silicon nitride in the second layer 62, it is possible to form the n-type impurity concentration peak P2 at the position of the second part. It is thus possible to suppress diffusion of the p-type impurity into the active layer 5 as previously described, and as a result, it is possible to improve the life of the light-emitting element 1.

Summary of the Embodiment

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A nitride semiconductor light-emitting element (1), comprising: an n-type semiconductor layer (4); a p-type semiconductor layer (7); an active layer (5) provided between the n-type semiconductor layer (4) and the p-type semiconductor layer (7); and an electron blocking layer (6) comprising at least one layer and being provided between the active layer (5) and the p-type semiconductor layer (7), wherein the at least one layer of the electron blocking layer (6) comprises a peak-containing layer having an n-type impurity concentration peak (P2) in an n-type impurity concentration distribution along a stacking direction, and wherein the n-type impurity concentration peak (P2) appears as a local maximum in the n-type impurity concentration distribution along the stacking direction in the peak-containing layer and has an n-type impurity concentration of not less than 10 times a smallest value of the n-type impurity concentration in a region (R2) along the stacking direction between positions that are separated from a position of the peak in the stacking direction on both sides in the stacking direction by 10% of a thickness (L) of the peak-containing layer.

[2] The nitride semiconductor light-emitting element (1) described in [1], wherein the n-type impurity concentration peak (P2) has an n-type impurity concentration of not less than 21 times a smallest value of the n-type impurity concentration in the n-type impurity concentration distribution along the stacking direction in the peak-containing layer.

[3] The nitride semiconductor light-emitting element (1) described in [1] or [2], wherein the electron blocking layer (6) comprises a first layer (61) formed adjacent to an upper side of the active layer (5) and a second layer (62) formed on an upper side of the first layer (61), and wherein the second layer (62) comprises the peak-containing layer.

[4] The nitride semiconductor light-emitting element (1) described in any one of [1] to [3], wherein the peak-containing layer comprises at least one Al composition ratio peak in an Al composition ratio distribution along the stacking direction.

[5] A method for manufacturing a nitride semiconductor light-emitting element (1) that comprises an n-type semiconductor layer (4), a p-type semiconductor layer (7), an active layer (5) provided between the n-type semiconductor layer (4) and the p-type semiconductor layer (7), and an electron blocking layer (6) comprising at least one layer and being provided between the active layer (5) and the p-type semiconductor layer (7), the method comprising: in a process of making the peak-containing layer constituting the at least one layer of the electron blocking layer (6), forming the peak-containing layer so that an n-type impurity concentration peak (P2) appears in an n-type impurity concentration distribution along a stacking direction in the peak-containing layer, wherein the n-type impurity concentration peak (P2) appears as a local maximum in the n-type impurity concentration distribution along the stacking direction in the peak-containing layer and has an n-type impurity concentration of not less than 10 times a smallest value of the n-type impurity concentration in a region along the stacking direction between positions that are separated from a position of the peak in the stacking direction on both sides in the stacking direction by 10% of a thickness (L) of the peak-containing layer.

[6] The method for manufacturing a nitride semiconductor light-emitting element (1) described in [5], wherein the process of making the peak-containing layer comprises forming a silicon nitride-containing portion containing $SiN_X$ in a part of a region of the peak-containing layer along the stacking direction, and wherein the peak-containing layer has the n-type impurity concentration peak (P2) in the n-type impurity concentration distribution along the stacking direction in the region along the stacking direction in which the silicon nitride-containing portion is formed.

REFERENCE SIGNS LIST

1 Light-emitting element
11 N-side electrode
12 P-side electrode
2 Substrate
3 Buffer layer
4 N-type cladding layer (n-type semiconductor layer)
5 Active layer
51 Barrier layer
52 Well layer
6 Electron blocking layer
61 First layer
62 Second layer (peak-containing layer)
600 Silicon nitride-containing portion
601 High Al composition portion
602 High n-type impurity concentration portion
603 High p-type impurity concentration portion
P-type contact layer (p-type semiconductor layer)
P1 Al composition ratio peak
P2 N-type impurity concentration peak
P3 P-type impurity concentration peak

What is claimed is:

1. A nitride semiconductor light-emitting element, comprising:
    an n-type semiconductor layer;
    a p-type semiconductor layer;
    an active layer provided between the n-type semiconductor layer and the p-type semiconductor layer; and
    an electron blocking layer comprising at least one layer and being provided between the active layer and the p-type semiconductor layer,
    wherein the at least one layer of the electron blocking layer comprises a peak-containing layer having an n-type impurity concentration peak in an n-type impurity concentration distribution along a stacking direction, and
    wherein the n-type impurity concentration peak appears as a local maximum in the n-type impurity concentration distribution along the stacking direction in the peak-containing layer and has an n-type impurity concentration of not less than 10 times a smallest value of the n-type impurity concentration in a region along the stacking direction between positions that are separated from a position of the peak in the stacking direction on both sides in the stacking direction by 10% of a thickness of the peak-containing layer.

2. The nitride semiconductor light-emitting element according to claim 1, wherein the n-type impurity concentration peak has an n-type impurity concentration of not less than 21 times a smallest value of the n-type impurity concentration in the n-type impurity concentration distribution along the stacking direction in the peak-containing layer.

3. The nitride semiconductor light-emitting element according to claim 1, wherein the electron blocking layer comprises a first layer formed adjacent to an upper side of the active layer and a second layer formed on an upper side of the first layer, and wherein the second layer comprises the peak-containing layer.

4. The nitride semiconductor light-emitting element according to claim 1, wherein the peak-containing layer comprises at least one Al composition ratio peak in an Al composition ratio distribution along the stacking direction.

5. A method for manufacturing a nitride semiconductor light-emitting element that comprises an n-type semiconductor layer, a p-type semiconductor layer, an active layer provided between the n-type semiconductor layer and the p-type semiconductor layer, and an electron blocking layer comprising at least one layer and being provided between the active layer and the p-type semiconductor layer, the method comprising:
    in a process of making the peak-containing layer constituting the at least one layer of the electron blocking layer, forming the peak-containing layer so that an n-type impurity concentration peak appears in an n-type impurity concentration distribution along a stacking direction in the peak-containing layer,
    wherein the n-type impurity concentration peak appears as a local maximum in the n-type impurity concentration distribution along the stacking direction in the peak-containing layer and has an n-type impurity concentration of not less than 10 times a smallest value of the n-type impurity concentration in a region along the stacking direction between positions that are separated from a position of the peak in the stacking direction on both sides in the stacking direction by 10% of a thickness of the peak-containing layer.

6. The method according to claim 5, wherein the process of making the peak-containing layer comprises forming a silicon nitride-containing portion containing $SiN_X$ in a part of a region of the peak-containing layer along the stacking direction, and wherein the peak-containing layer has the n-type impurity concentration peak in the n-type impurity concentration distribution along the stacking direction in the region along the stacking direction in which the silicon nitride-containing portion is present.

7. The nitride semiconductor light-emitting element according to claim 1, wherein at least a portion of a region R2 along the stacking direction above and below the position of the n-type impurity concentration peak P2 within the 10% thickness and a portion of the region R1 along the stacking direction above and below the position of the Al composition ratio peak P1 within the 10% thickness are formed at a same position in the stacking direction.

8. The nitride semiconductor light-emitting element according to claim 1, wherein the peak-containing layer comprises AlGaN having an Al composition ratio of 50% or more and precipitated silicon nitride.

\* \* \* \* \*